(12) United States Patent
Murase et al.

(10) Patent No.: US 12,520,466 B2
(45) Date of Patent: Jan. 6, 2026

(54) TAPE FEEDER

(71) Applicant: FUJI CORPORATION, Chiryu (JP)

(72) Inventors: Hiroki Murase, Nagoya (JP); Yusuke Yamakage, Anjo (JP); Kenzo Ishikawa, Kariya (JP); Koki Obama, Kari (JP); Daiki Suzuki, Toyokawa (JP)

(73) Assignee: FUJI CORPORATION, Chiryu (JP)

( * ) Notice: Subject to any disclaimer, the term of this patent is extended or adjusted under 35 U.S.C. 154(b) by 464 days.

(21) Appl. No.: 18/004,602

(22) PCT Filed: Jul. 9, 2020

(86) PCT No.: PCT/JP2020/026838
§ 371 (c)(1),
(2) Date: Jan. 6, 2023

(87) PCT Pub. No.: WO2022/009381
PCT Pub. Date: Jan. 13, 2022

(65) Prior Publication Data
US 2023/0247816 A1    Aug. 3, 2023

(51) Int. Cl.
*H05K 13/02* (2006.01)
*B65H 23/04* (2006.01)

(52) U.S. Cl.
CPC ........... *H05K 13/02* (2013.01); *B65H 23/044* (2013.01); *B65H 2701/1942* (2013.01)

(58) Field of Classification Search
CPC .. H05K 13/02; H05K 13/0419; B65H 23/044; B65H 2701/1942
See application file for complete search history.

(56) References Cited

U.S. PATENT DOCUMENTS

| 6,402,452 B1 * | 6/2002 | Miller | H05K 13/0419 |
| | | | 414/412 |
| 11,039,560 B2 * | 6/2021 | Yukawa | H05K 13/0406 |

(Continued)

FOREIGN PATENT DOCUMENTS

| JP | 2001-7592 A | 1/2001 |
| JP | 2002-198690 A | 7/2002 |

(Continued)

OTHER PUBLICATIONS

International Search Report issued Sep. 1, 2020 in PCT/JP2020/026838 filed on Jul. 9, 2020, 2 pages.

*Primary Examiner* — Alex B Efta
*Assistant Examiner* — Alexander S Wright
(74) *Attorney, Agent, or Firm* — Oblon, McClelland, Maier & Neustadt, L.L.P.

(57) ABSTRACT

A tape feeder feeds a component supply tape including a cover tape adhered on a carrier tape accommodating multiple components to a predetermined supply position, and separates the cover tape from the carrier tape in front of the supply position to expose a component on the carrier tape. The tape feeder includes a pair of rotating members configured to separate the cover tape from the carrier tape by pinching and drawing the cover tape; a drum member configured to rotate and wind the cover tape drawn by the pair of rotating members; a driving motor; and a distribution mechanism configured to distribute a rotational driving force from the driving motor to one rotating member of the pair of rotating members and the drum member.

7 Claims, 9 Drawing Sheets

(56) References Cited

U.S. PATENT DOCUMENTS

2002/0062927 A1* 5/2002 Hwang .............. H05K 13/0417
   156/362
2011/0042437 A1* 2/2011 Sugie ................... B65H 23/038
   226/15

FOREIGN PATENT DOCUMENTS

| JP | 2010-50122 A | 3/2010 |
| JP | 4858406 B2 | 1/2012 |

* cited by examiner

TAPE FEEDER

TECHNICAL FIELD

This specification discloses a tape feeder.

BACKGROUND ART

Conventionally, as this type of tape feeders, a tape feeder has been proposed in which a tape feeding mechanism for drawing and feeding a carrier tape wound a reel from the reel, a tape separating mechanism for separating a top tape from the carrier tape, and a tape storage chamber for storing the separated top tape are incorporated in a housing (for example, refer to Patent Literature 1). The tape feeding mechanism includes a first sprocket rotated by a rotational driving force transmitted from a motor to feed the carrier tape. The tape separating mechanism includes a second sprocket engaging with a feeding hole of the carrier tape, and to which the rotational driving force is applied by the carrier tape fed along a predetermined path, and a pair of gears meshing with each other. The pair of gears rotates in mutually opposite directions by transmitting the rotational driving force from the second sprocket to one of the gears. The top tape is pinched between the pair of gears, and the pair of gears rotate in the mutually opposite directions to feed the top tape toward the tape storage chamber.

PATENT LITERATURE

Patent Literature 1: JP-A-2010-050122

SUMMARY OF THE INVENTION

Technical Problem

However, the above-described tape feeder is to merely feed the separated top tape into a space defined as the tape storage chamber. Therefore, in order that all of the top tapes separated from the carrier tape wound around the reel can be collected, a large space is required, thereby resulting in an increase in a size of the tape feeder.

A main object of the present disclosure is to properly collect a cover tape separated from a carrier tape, and to decrease a size of a tape feeder.

Solution to Problem

The present disclosure adopts the following means to achieve the above-described main object.

According to the present disclosure, there is provided a tape feeder in which a component supply tape including a cover tape adhered on a carrier tape accommodating multiple components is fed to a predetermined supply position, and the cover tape is separated from the carrier tape in front of the supply position to expose a component on the carrier tape, the tape feeder including a pair of rotating members configured to separate the cover tape from the carrier tape by pinching and drawing the cover tape; a drum member configured to rotate and wind the cover tape drawn by the pair of rotating members; a driving motor; and a distribution mechanism configured to distribute a torque from the driving motor to one rotating member of the pair of rotating members and the drum member.

The tape feeder of the present disclosure includes the pair of rotating members configured to separate the cover tape from the carrier tape by pinching and drawing the cover tape, and the drum member configured to rotate and wind the cover tape drawn by the pair of rotating members. Torques are respectively transmitted via a distribution mechanism from the same motor to one rotating member of the pair of rotating members and the drum member. In this manner, the cover tape separated from the carrier tape can be properly collected, and a size of the tape feeder can be further decreased by sharing a driving source.

DESCRIPTION OF EMBODIMENTS

An embodiment of the present disclosure will be described with reference to the drawings.

Figure 1:
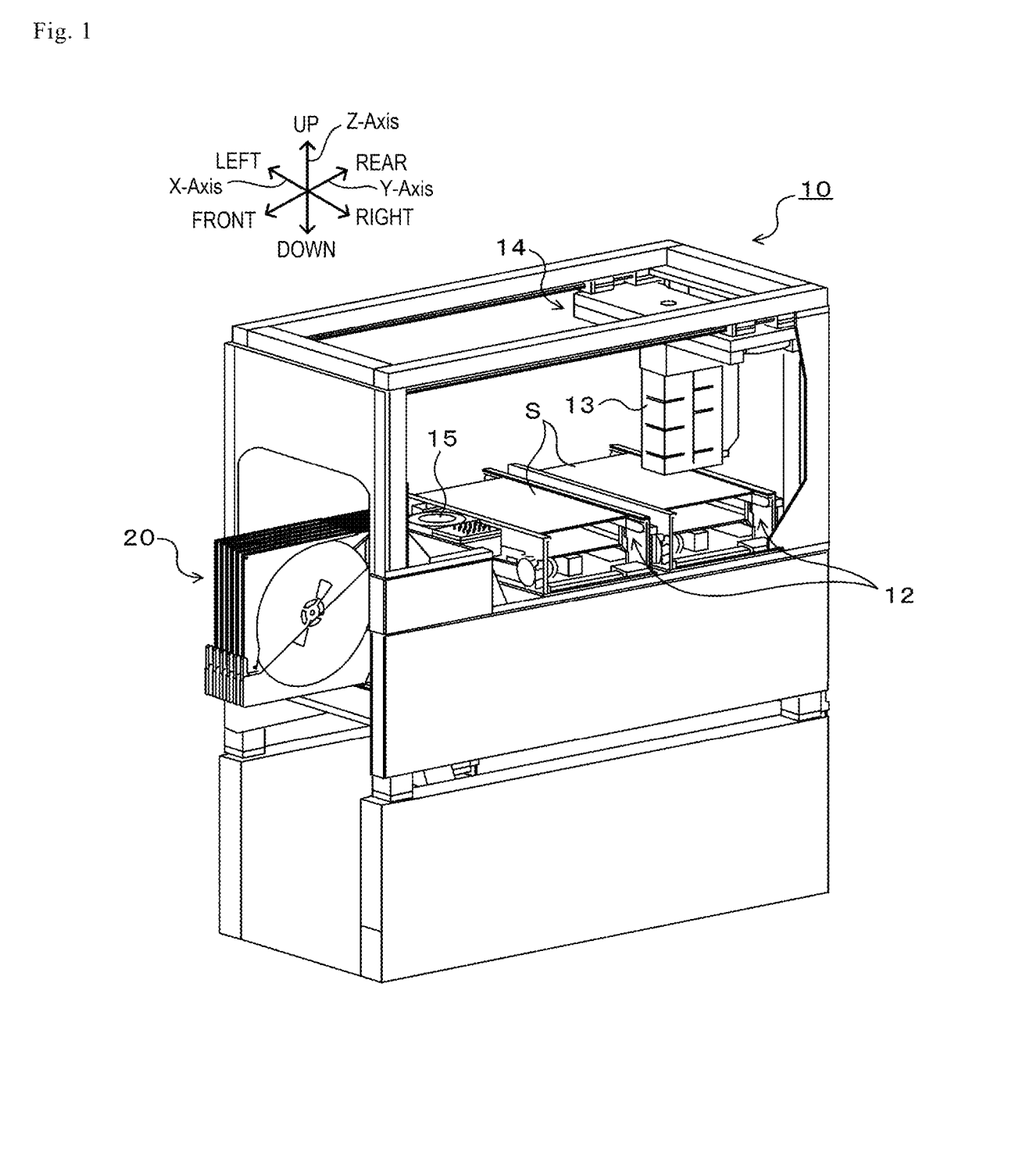
FIG. 1 is a schematic configuration diagram of a component mounter.
Figure 2:
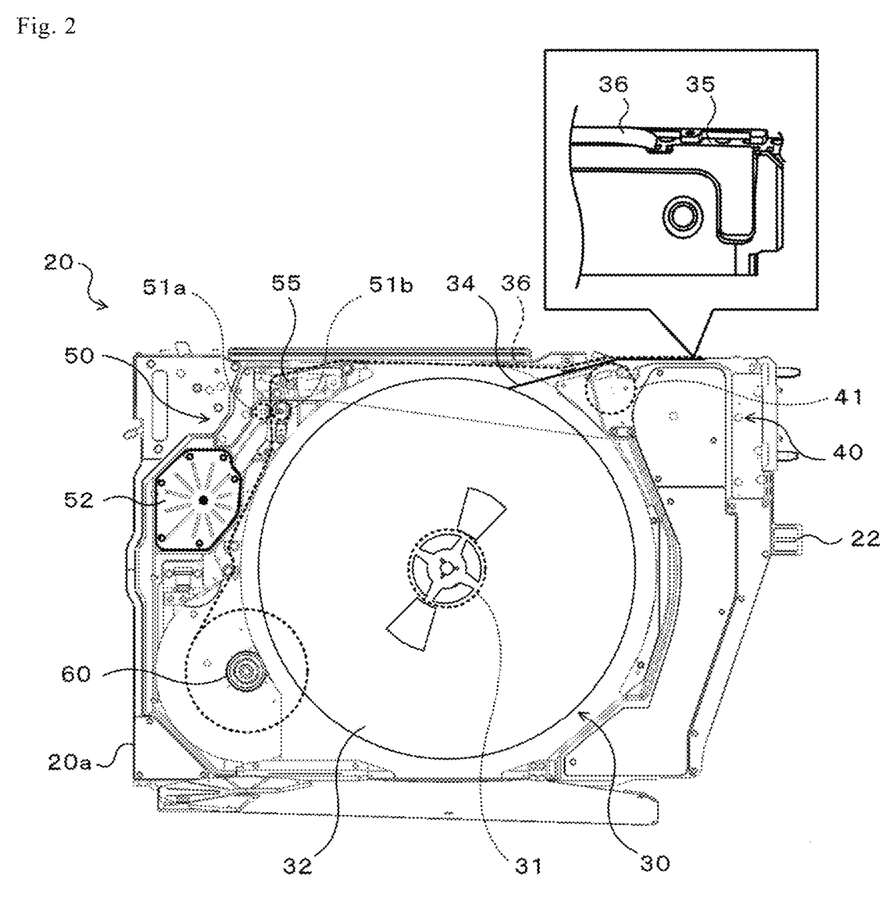
FIG. 2 is a schematic configuration diagram of a tape feeder.
Figure 3:
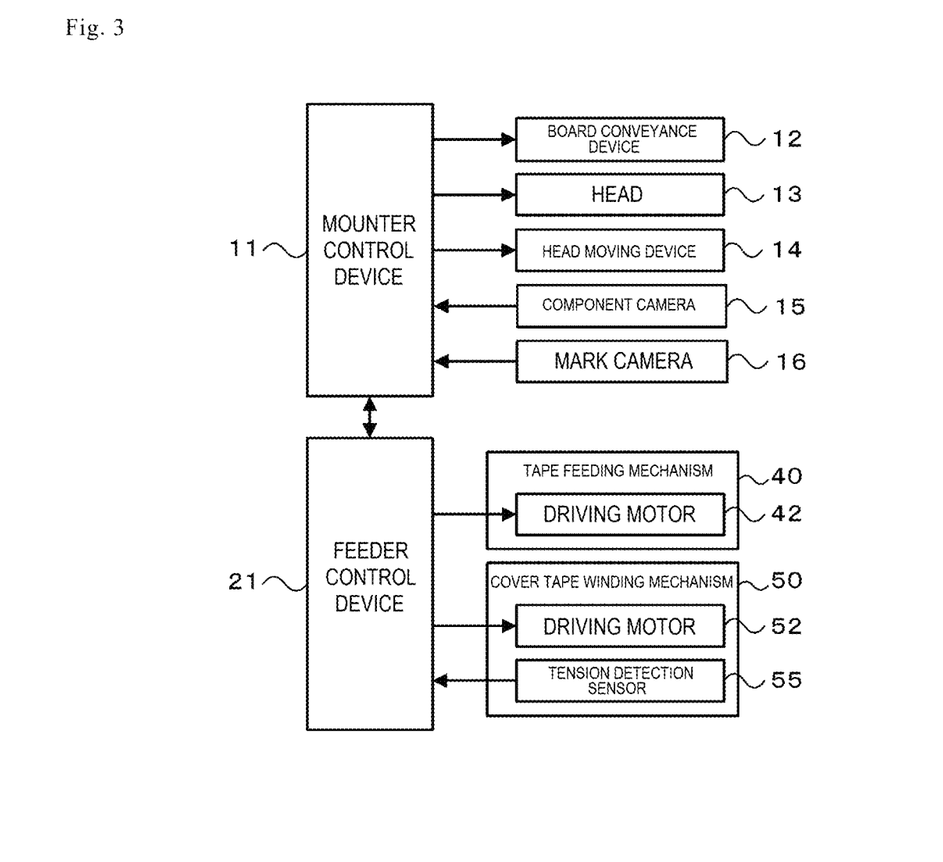
FIG. 3 is a block diagram illustrating an electrical connection relationship between a mounter control device and a feeder control device.
Figure 4:
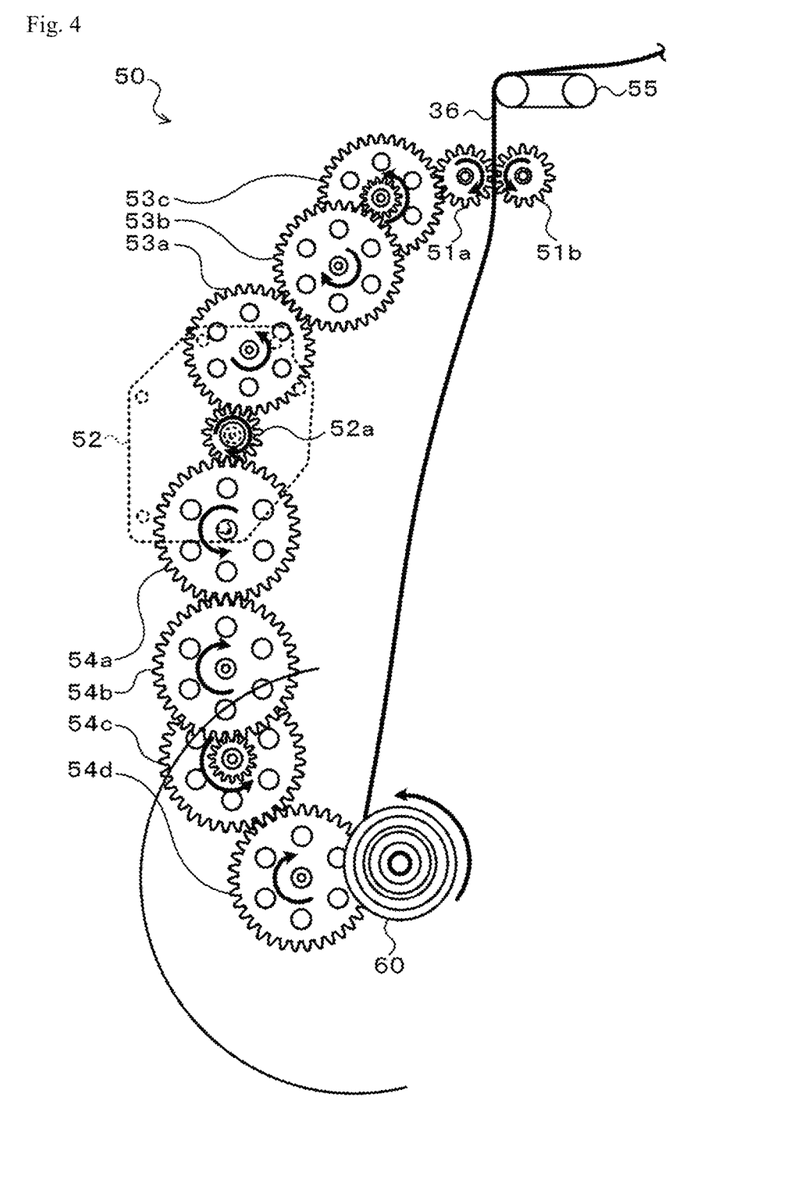
FIG. 4 is a schematic configuration diagram of a cover tape winding mechanism.
Figure 5:
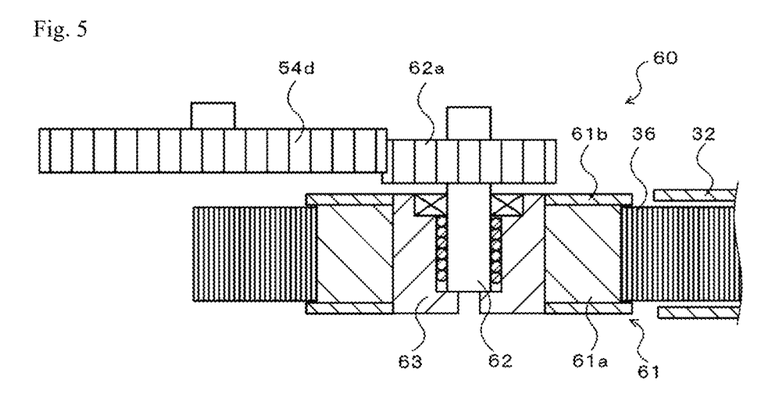
FIG. 5 is a sectional view of a collection drum.
Figure 6:
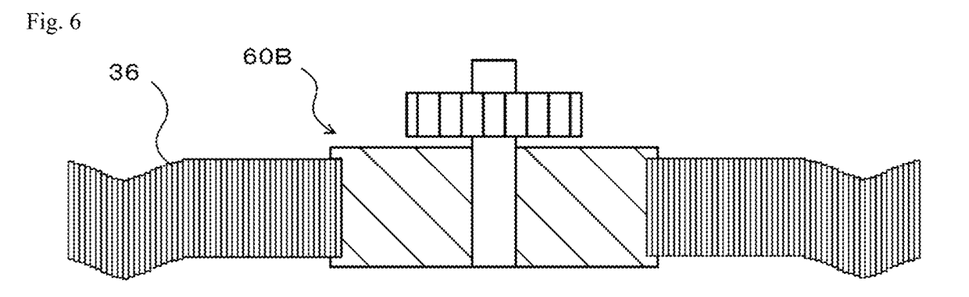
FIG. 6 is a sectional view of a cover tape wound around a drum body.
Figure 7:
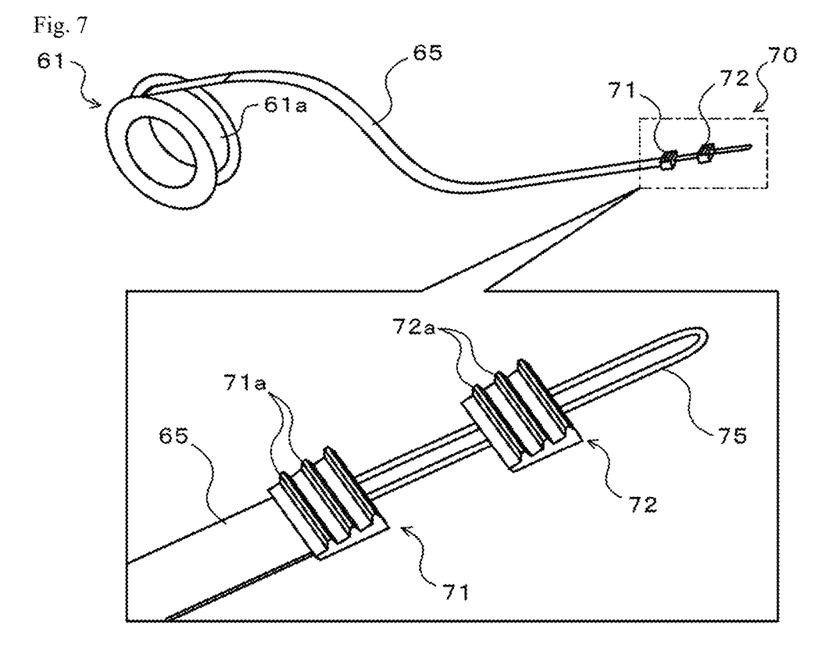
FIG. 7 is a schematic configuration diagram of an extension tape including a clamper.
Figure 8:
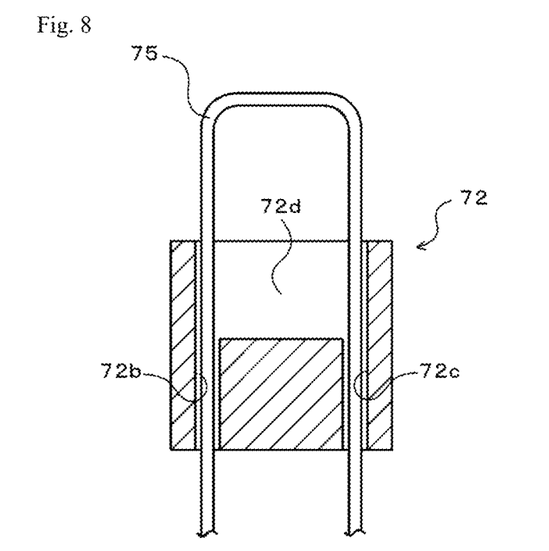
FIG. 8 is a sectional view of a second block.

FIG. 1 is a schematic configuration diagram of a component mounter. FIG. 2 is a schematic configuration diagram of a tape feeder. FIG. 3 is a block diagram illustrating an electrical connection relationship between a mounter control device and a feeder control device. FIG. 4 is a schematic configuration diagram of a cover tape winding mechanism. FIG. 5 is a sectional view of a collection drum. FIG. 6 is a sectional view of a cover tape wound around a drum body. FIG. 7 is a schematic configuration diagram of an extension tape including a clamper. FIG. 8 is a sectional view of a second block. In FIG. 1, a left-right direction represents an X-axis direction, a front-rear direction represents a Y-axis direction, and an up-down direction represents a Z-axis direction.

As illustrated in FIG. 1, component mounter 10 includes a mounter body including mounter control device 11 (refer to FIG. 3), board conveyance device 12, head 13, and head moving device 14, and tape feeder 20 attachable to and detachable from the mounter body. Board conveyance device 12 conveys board S by a belt conveyor. Head 13 includes a suction nozzle that can be lifted and lowered in the up-down direction (Z-axis direction), causes the suction nozzle to pick up a component, and mounts the component on the board S conveyed by board conveyance device 12. Head moving device 14 moves head 13 in a horizontal direction (XY-axis direction). In addition, the mounter body includes component camera 15 and mark camera 16. Component camera 15 images the component picked up by the suction nozzle from below to detect a pickup deviation. Mark camera 16 is installed in head 13 or head moving device 14, and images a reference mark attached to board S from above to detect a position of conveyed board S. Mounter control device 11 includes a well-known CPU, a ROM, and a RAM. Mounter control device 11 outputs a control signal to board conveyance device 12, head 13, or head moving device 14, and inputs an imaging signal from component camera 15 or mark camera 16.

As illustrated in FIG. 2, tape feeder 20 is held to be attachable and detachable by a feeder base (not illustrated) provided on a front side of the mounter body. Tape feeder 20 includes feeder control device 21 (refer to FIG. 3), connector 22, tape reel 30, tape feeding mechanism 40, and cover tape winding mechanism 50. These are accommodated in rectangular feeder case 20a.

Tape reel 30 has core 31 around which component supply tape 34 having cover tape 36 adhered on a surface of carrier tape 35 is wound, and a pair of reel flanges 32 provided on both sides of core 31. Multiple cavities are formed in carrier tape 35 to be aligned at a predetermined interval in a longitudinal direction of carrier tape 35. Each of the cavities accommodates the component. The components are protected by cover tape 36 adhered to carrier tape 35.

Tape feeding mechanism 40 pulls carrier tape 35 (component supply tape 34) from tape reel 30, and feeds carrier tape 35 to a component supply position. Tape feeding mechanism 40 has sprocket 41 whose outer periphery is provided with engagement claws engaging with sprocket holes formed at an equal interval in carrier tape 35, and driving motor 42 (for example, a stepping motor) rotationally driving sprocket 41. Tape feeder 20 sequentially supplies the components accommodated in carrier tape 35 to the component supply positions by causing driving motor 42 to drive sprocket 41 by a predetermined rotation amount and feeding carrier tape 35 engaged with sprocket 41 by a predetermined amount. The component accommodated in carrier tape 35 is brought into an exposed state at the component supply position by separating cover tape 36 in front of the component supply position, and is picked up by the suction nozzle. Cover tape 36 adhered to carrier tape 35 is folded back in a direction opposite to a feeding direction of carrier tape 35 in front of the component supply position, and is separated from carrier tape 35 by being fed in the opposite direction by cover tape winding mechanism 50.

As illustrated in FIG. 4, cover tape winding mechanism 50 includes a pair of winding gears 51a and 51b, driving motor 52 (for example, a stepping motor), multiple first transmission gears 53a to 53c, multiple second transmission gears 54a to 54d, and collection drum 60.

The pair of winding gears 51a and 51b mesh with each other, and are installed on sides opposite to an end portion inside feeder case 20a in the feeding direction (right direction in FIG. 2) of carrier tape 35. One winding gear 51a of the pair of winding gears 51a and 51b is a driving gear configured to rotate by transmitting a torque from driving motor 52. Other winding gear 51b is a driven gear rotated in an opposite direction in accordance with rotation of one winding gear 51a. The pair of winding gears 51a and 51b are rotated in mutually opposite directions by the torque transmitted from driving motor 52 in a state where cover tape 36 is pinched between the pair of winding gears 51a and 51b. In this manner, cover tape 36 folded back in a direction opposite to the feeding direction of carrier tape 35 is fed in the opposite direction, and is separated from carrier tape 35. Tension detection sensor 55 configured to output an on-signal when a tension exceeding a predetermined tension acts on cover tape 36 is installed on an upstream side of the pair of winding gears 51a and 51b in the feeding direction of cover tape 36.

As illustrated in FIG. 2, collection drum 60 is installed below the pair of winding gears 51a and 51b to be close to an outer edge portion of reel flange 32. As illustrated in FIG. 5, collection drum 60 has drum body 61, drum shaft 62 serving as a rotary shaft of drum body 61, and torque limiter 63 (for example, a spring-type torque limiter). Drum gear 62a is attached to drum shaft 62, and a torque is transmitted from driving motor 52. Drum body 61 has core 61a around which cover tape 36 is wound, and a pair of drum flanges 61b (small diameter flanges) provided on both sides of core 61a. Drum body 61 is rotated by the torque transmitted from driving motor 52, thereby winding cover tape 36 fed by the pair of winding gears 51a and 51b around core 61a and collecting cover tape 36.

Motor gear 52a attached to the rotary shaft of driving motor 52 meshes with winding gear 51a via multiple first transmission gears 53a to 53c in which adjacent gears mesh with each other. Furthermore, motor gear 52a meshes with drum gear 62a via multiple second transmission gears 54a to 54d in which adjacent gears mesh with each other. In this manner, the torque transmitted from driving motor 52 is distributed to winding gear 51a and drum gear 62a at a predetermined torque ratio, and the pair of winding gears 51a and 51b and collection drum 60 (drum body 61) are respectively rotated. In the present embodiment, first transmission gears 53a to 53c and second transmission gears 54a to 54d are configured to have the larger torque distributed from driving motor 52 to winding gear 51a than the torque distributed to drum body 61 (the torque distributed from driving motor 52 to drum body 61 is smaller than the torque distributed to winding gear 51a). That is, first transmission gears 53a to 53c and second transmission gears 54a to 54d are configured to have a higher rotation speed ratio of second transmission gears 54a to 54d (ratio of the rotation speed on drum body 61 side with respect to the rotation speed on driving motor 52 side) than a rotation speed ratio of first transmission gears 53a to 53c (ratio of the rotation speed on winding gear 51a side with respect to the rotation speed on driving motor 52 side). In this manner, while sharing a driving source, cover tape winding mechanism 50 can apply a tension suitable for separation to cover tape 36 when separating cover tape 36 from carrier tape 35, and can apply a tension suitable for winding when winding and collecting cover tape 36 to the cover tape.

As illustrated in FIG. 5, torque limiter 63 is installed to be interposed between drum body 61 and drum shaft 62. Torque limiter 63 slips when the torque exceeding a prescribed torque acts on drum body 61, and is configured to serve as a spring-type torque limiter, for example. In this manner, it is possible to prevent an excessive tension from acting on the cover tape 36 when cover tape 36 is wound around drum body 61. Here, when cover tape 36 is separated from carrier tape 35, an adhesive or a tape scrap may adhere to cover tape 36. Since a thickness of cover tape 36 to which the adhesive or the tape scrap adheres is not even in a width direction, in collection drum 60B which does not include the torque limiter, cover tape 36 may be wound around drum body 61 due to the excessive tension in some cases. In this case, as illustrated in FIG. 6, cover tape 36 is likely to deviate in the width direction due to the uneven thickness of cover tape 36. When cover tape 36 wound around drum body 61 deviates in the width direction, cover tape 36 may come into sliding contact with an inner wall of feeder case 20a, and an overload may be applied to driving motor 52, thereby causing a possibility that a winding failure may occur. In the present embodiment, in addition to decreasing the torque distributed from driving motor 52 to drum body 61 than the torque distributed to winding gear 51a, cover tape winding mechanism 50 is configured such that drum body 61 slips when the excessive torque acts on drum body 61. In this manner, cover tape 36 can be wound around drum body 61 with a proper tension, and the occurrence of the winding failure can be prevented.

As illustrated in FIG. 7, extension tape 65 is connected to core 61a around which cover tape 36 of drum body 61 is wound. Extension tape 65 compensates for a shortage length when a length of the cover tape of the leader portion is shorter than a distance from a separation position of cover tape 36 to collection drum 60. In particular, since there is no leader portion in a case of tape reel 30 when in use, extension tape 65 is required.

Figure 9:
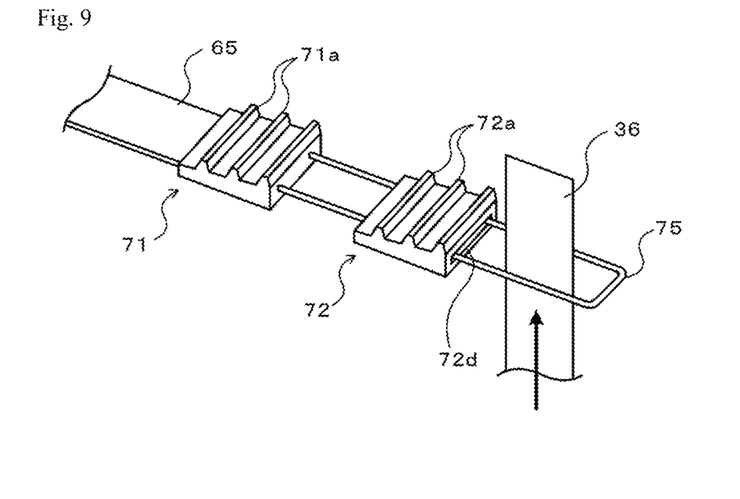
FIG. 9 is a view for describing a state where the cover tape is joined to the extension tape.
Figure 10:
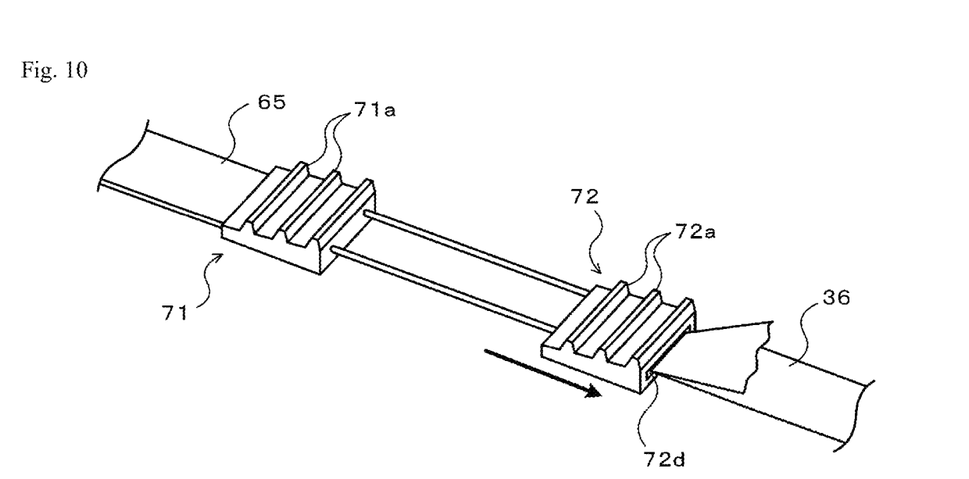
FIG. 10 is a view schematically illustrating a state where the cover tape is joined to the extension tape.

Tape joining clamper 70 for joining a tip of cover tape 36 is provided in a tip of extension tape 65. Clamper 70 has first block 71 fixed to the tip of extension tape 65, loop-shaped (U-shaped) wire 75 fixed to the tip of first block 71, and second block 72 slidable in an extending direction of wire 75. Gear teeth 71a and 72a meshing with winding gear 51a are formed on one surface of first block 71 and second block 72 to be capable of passing between the pair of winding gears 51a and 51b. As illustrated in FIG. 8, insertion holes 72b and 72c into which two linear portions of wire 75 are inserted at an interval in the width direction are formed in second block 72. In addition, recessed portion 72d communicating with insertion holes 72b and 72c and into which a loop tip of wire 75 is inserted is formed in second block 72. A tip portion of extension tape 65 and a tip portion of cover tape 36 are joined in such a manner that the tip of cover tape 36 passes through the inside of the loop of wire 75 (refer to FIG. 9) and second block 72 slides toward the tip side of the loop to squeeze the loop. In this manner, as illustrated in FIG. 10, cover tape 36 is folded back by the loop of wire 75, and is clamped in such a manner that a folded-back portion of cover tape 36 is inserted into recessed portion 72d of second block 72. Since gear teeth 71a and 72a are formed on one surface of first block 71 and second block 72, front and rear surfaces of extension tape 65 can be easily distinguished. Drum body 61 is rotated in a state where the tip portion of extension tape 65 and the tip portion of cover tape 36 are joined to each other, thereby winding and collecting cover tape 36 together with extension tape 65.

Drum flanges 61b having a small diameter are provided on both sides of core 61a of drum body 61. Extension tape 65 is guided by drum flange 61b when being wound around core 61a. On the other hand, since drum flange 61b has the small diameter, cover tape 36 is not guided by drum flange 61b when cover tape 36 is wound around core 61a. Since drum body 61 is installed to be close to an outer edge portion of reel flange 32, as illustrated in FIG. 5, cover tape 36 is progressively wound to enter the pair of reel flanges 32. In this manner, a size of tape feeder 20 can be further decreased.

Feeder control device 21 is configured to include a well-known CPU, a ROM, and a RAM. As illustrated in FIG. 3, feeder control device 21 outputs a driving signal to tape feeding mechanism 40 (driving motor 42) or cover tape winding mechanism 50 (driving motor 52). In addition, feeder control device 21 inputs a detection signal from tension detection sensor 55. Feeder control device 21 can communicate with mounter control device 11 of component mounter 10 on which tape feeder 20 is mounted via connector 22.

Figure 11:
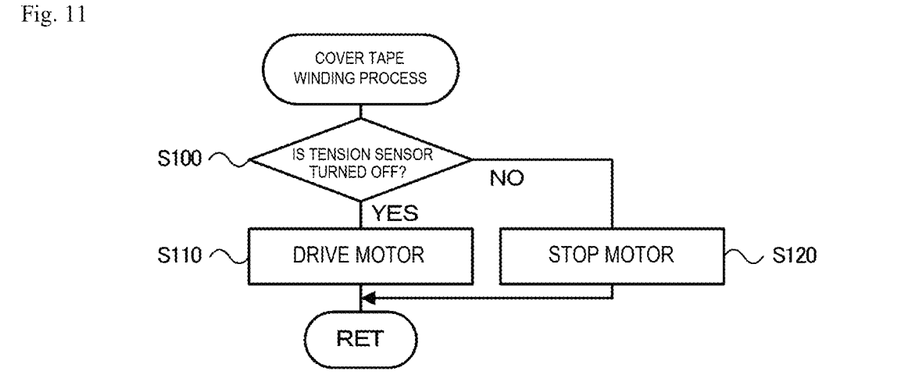
FIG. 11 is a flowchart illustrating an example of a cover tape winding process.

Next, an operation of tape feeder 20 will be described. In particular, an operation of driving motor 52 for separating cover tape 36 from carrier tape 35 and collecting separated cover tape 36 will be described. FIG. 11 is a flowchart illustrating an example of a cover tape winding process performed by feeder control device 21. This process is performed when supplying the components is requested from mounter control device 11 of component mounter 10 on which tape feeder 20 is mounted. When supplying the components is requested from mounter control device 11, feeder control device 21 performs a carrier tape feeding process for feeding carrier tape 35 by a predetermined amount by controlling driving motor 42 of tape feeding mechanism 40 and rotating sprocket 41 by a predetermined rotation amount. A cover tape winding process is performed by feeder control device 21 together with the carrier tape feeding process.

When the cover tape winding process is performed, feeder control device 21 determines whether or not the detection signal from tension detection sensor 55 is an off-signal (Step S100). When feeder control device 21 determines that the detection signal from tension detection sensor 55 is the off-signal, feeder control device 21 drives driving motor 52 (Step S110), and completes the cover tape winding process. On the other hand, when feeder control device 21 determines that the detection signal from tension detection sensor 55 is not the off-signal but an on-signal, feeder control device 21 stops driving motor 52 (Step S120), and completes the cover tape winding process. In this manner, cover tape 36 can be separated from carrier tape 35 with a proper tension, and separated cover tape 36 can be wound around drum body 61.

A correspondence between principal elements of the present embodiment and principal elements disclosed in the appended claims will be described. That is, the pair of winding gears 51a and 51b of the present embodiment correspond to a pair of rotating members of the present disclosure, drum body 61 corresponds to a drum member, driving motor 52 corresponds to a driving motor, and first transmission gears 53a to 53c and second transmission gears 54a to 54d correspond to a distribution mechanism. In addition, torque limiter 63 corresponds to a torque limiter.

As a matter of course, the present disclosure is not limited to the above-described embodiment in any way, and the present disclosure can be embodied in various aspects as long as the aspects fall within the technical scope of the present disclosure.

For example, in the above-described embodiment, the pair of winding gears 51a and 51b are formed by gears, but may be formed by rollers.

In the above-described embodiment, drum body 61 has drum flanges 61b having the small diameter on both sides of core 61a, but may not have the drum flanges. According to this configuration, drum body 61 can be closer to tape reel 30, and thus, a size of tape feeder 20 can be further decreased.

Figure 12:
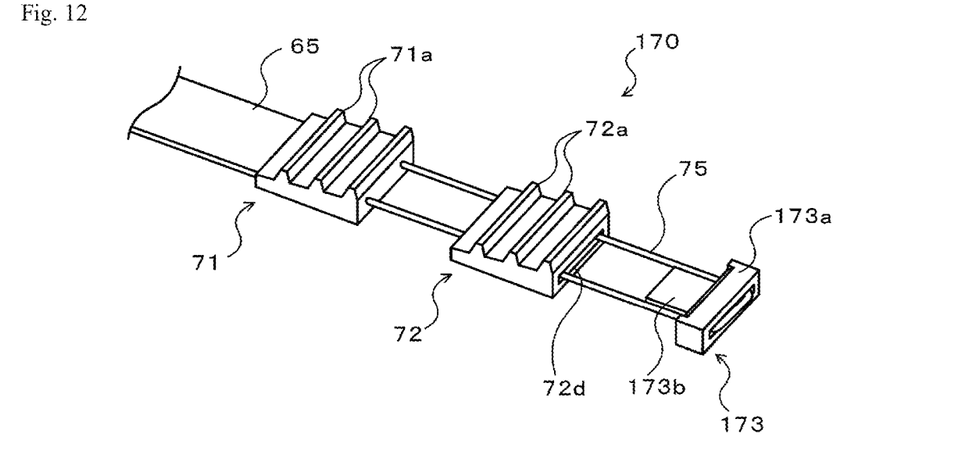
FIG. 12 is a schematic configuration diagram of a clamper according to another embodiment.
Figure 13:
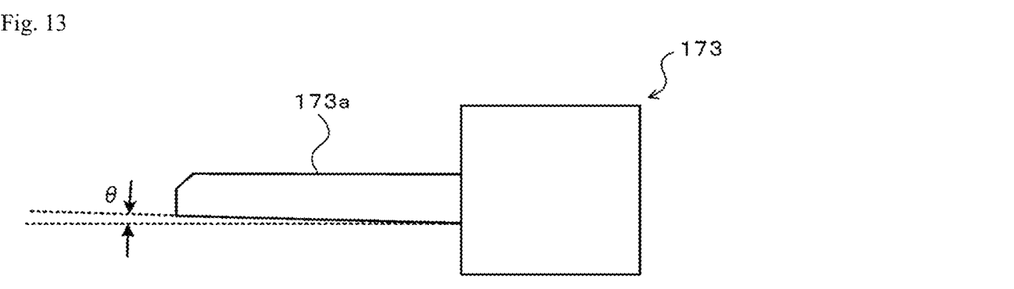
FIG. 13 is a side view of a press-fit member.
Figure 14:
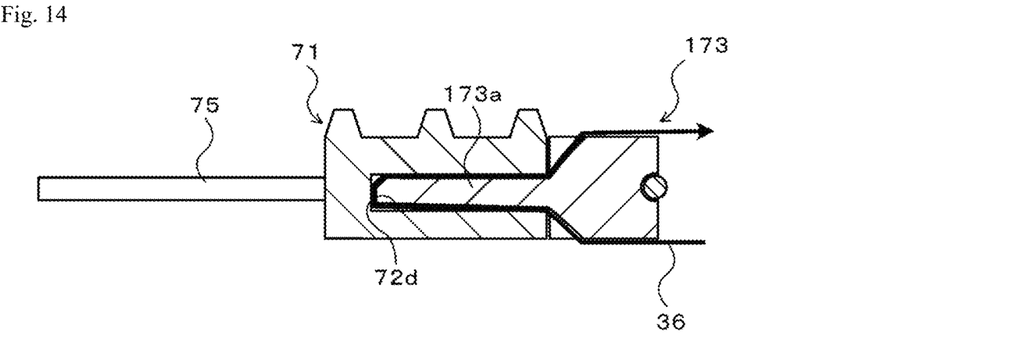
FIG. 14 is a view schematically illustrating a state where the cover tape is joined to the extension tape.
Figure 15:
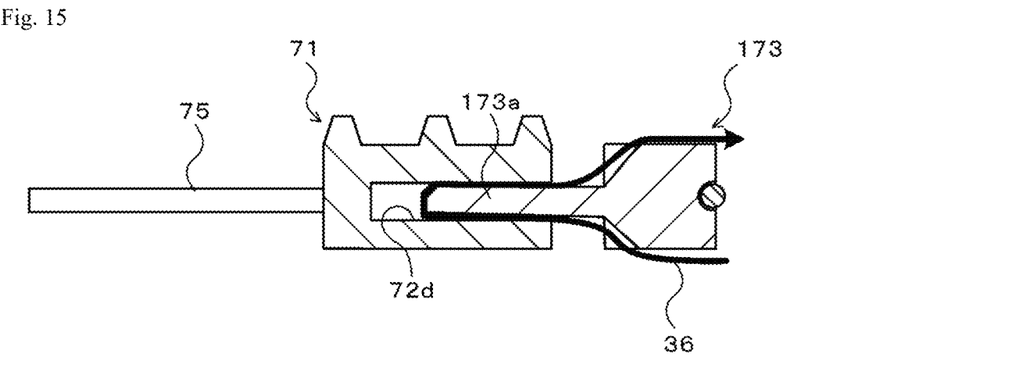
FIG. 15 is a view schematically illustrating a state where the cover tape is joined to the extension tape.

In the above-described embodiment, clamper 70 passes through the tip of cover tape 36 in the loop of wire 75, and clamps cover tape 36 by causing second block 72 to slide and squeeze the loop. In contrast, clamper 170 according to another embodiment illustrated in FIG. 12 may include press-fit member 173 including protruding portion 173*a* press-fitted into recessed portion 72*d* of second block 72. As illustrated in a side view in FIG. 13, protruding portion 173*a* of press-fit member 173 is formed in a shape in which one surface is tapered so that the thickness gradually decreases toward the tip. In clamper 170, cover tape 36 is joined in such a manner that the tip of cover tape 36 passes through the loop of wire 75, second block 72 slides to the tip side of the loop, and protruding portion 173*a* is press-fitted into recessed portion 72*d* of second block 72. In this manner, cover tape 36 is pinched and clamped between recessed portion 72*d* of second block 72 and protruding portion 173*a* of press-fit member 173 (refer to FIG. 14). Since the thickness of protruding portion 173*a* of press-fit member 173 decreases toward the tip, cover tapes 36 can be satisfactorily clamped, even when cover tapes 36 having different thicknesses are clamped (refer to FIG. 15).

Figure 16:
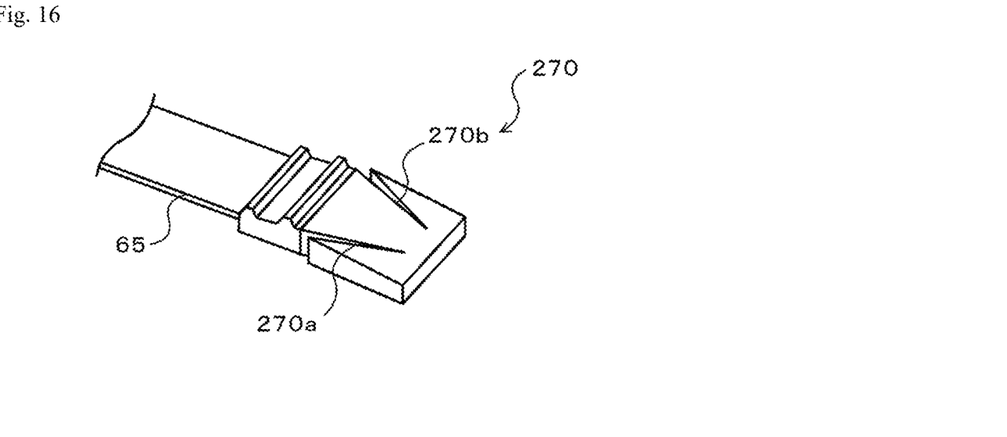
FIG. 16 is a schematic configuration diagram of a clamper according to another embodiment.
Figure 17:
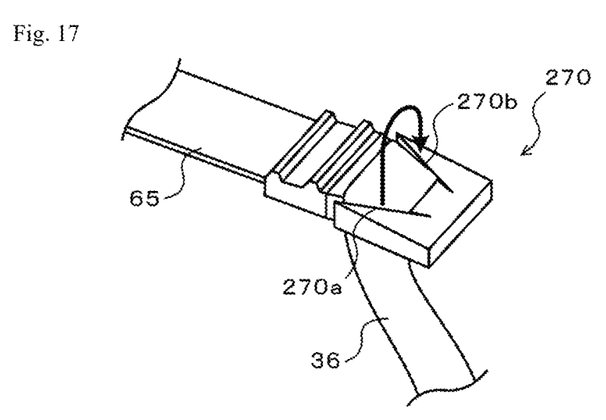
FIG. 17 is a view schematically illustrating a state where the cover tape is joined to the extension tape.
Figure 18:
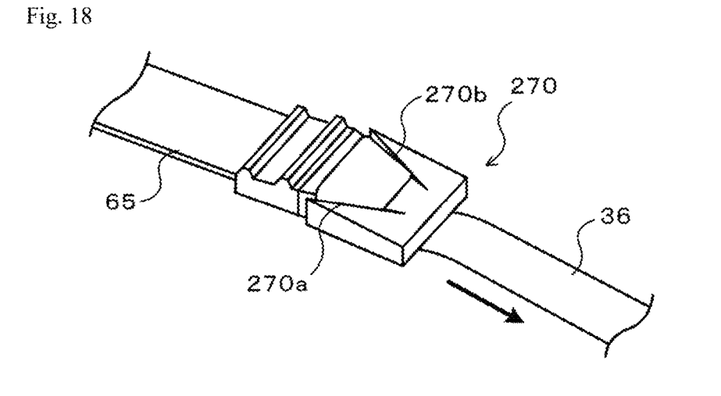
FIG. 18 is a view schematically illustrating a state where the cover tape is joined to the extension tape.

Clamper 270 according to another embodiment illustrated in FIG. 16 has a pair of V-shaped cutouts 270*a* and 270*b* extending to be closer to each other from both side surfaces toward the tip. In clamper 270, cover tape 36 is joined in such a manner that the tip portion of cover tape 36 is wound between the pair of cutouts 270*a* and 270*b* (refer to FIG. 17), and cover tape 36 is pulled in a direction away from extension tape 65 (refer to FIG. 18). In this manner, cover tape 36 is bitten into and clamped by the pair of cutouts 270*a* and 270*b*. When clamping of cover tape 36 is released, cover tape 36 may be pulled in the opposite direction.

As described above, according to the present disclosure, there is provided a tape feeder in which a component supply tape having a cover tape adhered on a carrier tape accommodating multiple components is fed to a predetermined supply position, and the cover tape is separated from the carrier tape in front of the supply position to expose components on the carrier tape, the tape feeder including a pair of rotating members configured to separate the cover tape from the carrier tape by pinching and drawing the cover tape; a drum member configured to rotate and wind the cover tape drawn by the pair of rotating members, a driving motor; and a distribution mechanism configured to distribute a torque from the driving motor to one rotating member of the pair of rotating members and the drum member.

The tape feeder of the present disclosure includes the pair of rotating members configured to separate the cover tape from the carrier tape by pinching and drawing the cover tape, and the drum member configured to rotate and wind the cover tape drawn by the pair of rotating members. Torques are respectively transmitted via a distribution mechanism from the same motor to one rotating member of the pair of rotating members and the drum member. In this manner, the cover tape separated from the carrier tape can be properly collected, and a size of the tape feeder can be further decreased by sharing a driving source.

In the tape feeder according to the present disclosure configured in this way, the distribution mechanism may distribute a larger torque to the one rotating member than the drum member. In this case, the distribution mechanism may further have a first transmission gear configured to transmit the torque from the driving motor to the one rotating member, and a second transmission gear configured to transmit the torque from the driving motor to the drum member, and the second transmission gear has a higher ratio of a rotation speed on an output side to a rotation speed on an input side than that of the first transmission gear. According to this configuration, while sharing a driving source, a tension suitable for separation can be applied to the cover tape when the cover tape is separated from the carrier tape, and a tension suitable for winding can be applied to the cover tape when the cover tape is wound and collected.

The tape feeder according to the present disclosure may further include a torque limiter provided in a rotary shaft of the drum member. According to this configuration, the tension acting on the cover tape can be held in a proper range when the cover tape is wound around the drum member, and occurrence of a winding failure of the cover tape can be suppressed.

In the tape feeder according to the present disclosure, the drum member may further include an extension tape whose one end is coupled to a core of the drum member and whose other end is coupled to a tip of the cover tape. According to this configuration, it is possible to compensate for a shortage length when the length of the cover tape of the leader portion is shorter than the distance from the separation position of the cover tape to the drum member. Furthermore, when there is no leader portion since the cover tape is used, the extension tape is required.

The tape feeder according to the present disclosure may further include a control device configured to control the driving motor; and a tension detection sensor configured to detect a tension of the cover tape drawn by the pair of rotating members, in which the control device may drive the driving motor when the tension having a threshold value or greater is not detected by the tension detection sensor, and may stop driving of the driving motor when the tension having the threshold value or greater is detected by the tension detection sensor. According to this configuration, the cover tape can be separated from the carrier tape with a proper tension.

INDUSTRIAL APPLICABILITY

The present disclosure can be used for a manufacturing industry of a tape feeder or a component mounter.

REFERENCE SIGNS LIST

10: component mounter, 11: mounter control device, 12: board conveyance device, 13: head, 14: head moving device, 15: component camera, 16: mark camera, 20: tape feeder, 20*a*: feeder case, 21: feeder control device, 22: connector, 30: tape reel, 31: core, 32: reel flange, 34: component supply tape, 35: carrier tape, 36: cover tape, 40: tape feeding mechanism, 41: sprocket, 42: driving motor, 50: cover tape winding mechanism, 51*a*, 51*b*: winding gear, 52: driving motor, 52*a*: motor gear, 53*a* to 53*c*: first transmission gear, 54*a* to 54*d*: second transmission gear, 55: tension detection sensor, 60, 60B: collection drum, 61: drum body, 61*a*: core, 61*b*: drum flange, 62: drum shaft, 62*a*: drum gear, 63: torque limiter, 65: extension tape, 70, 170, 270: clamper, 71: first block, 71*a*: gear tooth, 72: second block, 72*a*: gear tooth, 72*b*, 72*c*: insertion hole, 72*d*: recessed portion, 75: wire, 173: press-fit member, 173*a*: protruding portion, 270*a*, 270*b*: cutout, S: board.

The invention claimed is:

1. A tape feeder in which a component supply tape including a cover tape adhered on a carrier tape accommodating multiple components is fed to a predetermined supply position, and the cover tape is separated from the carrier tape in front of the supply position to expose a component on the carrier tape, the tape feeder comprising:
- a pair of rotating members configured to separate the cover tape from the carrier tape by pinching and drawing the cover tape;
- a drum member configured to rotate and wind the cover tape drawn by the pair of rotating members;
- a driving motor; and
- a distribution mechanism configured to distribute a torque from the driving motor to one rotating member of the pair of rotating members and the drum member, the distribution mechanism including a first transmission gear and a second transmission gear, the first transmission gear in mesh with the driving motor and configured to transmit the torque from the driving motor to the one rotating member, and the second transmission gear being in mesh with the driving motor and configured to transmit the torque from the driving motor to the drum member.

2. The tape feeder according to claim 1,
wherein the distribution mechanism distributes a larger torque to the one rotating member than to the drum member.

3. The tape feeder according to claim 2, wherein
the second transmission gear has a higher ratio of a rotation speed on an output side to a rotation speed on an input side than that of the first transmission gear.

4. The tape feeder according to claim 1, further comprising:
a torque limiter provided in a rotary shaft of the drum member.

5. The tape feeder according to claim 1,
wherein the drum member includes an extension tape whose one end is coupled to a core of the drum member and whose other end is coupled to a tip of the cover tape.

6. The tape feeder according to claim 1, further comprising:
a control device configured to control the driving motor; and
a tension detection sensor configured to detect a tension of the cover tape drawn by the pair of rotating members,
wherein the control device drives the driving motor when the tension having a threshold value or greater is not detected by the tension detection sensor, and stops the driving of the driving motor when the tension having the threshold value or greater is detected by the tension detection sensor.

7. The tape feeder according to claim 1, wherein
the driving motor includes a motor gear in mesh with both the first transmission gear and the second transmission gear.

* * * * *